United States Patent
Bjoerk et al.

(10) Patent No.: US 8,754,401 B2
(45) Date of Patent: Jun. 17, 2014

(54) IMPACT IONIZATION FIELD-EFFECT TRANSISTOR

(75) Inventors: Mikael T Bjoerk, Zurich (CH); Oliver Hayden, Herzogenaurach (DE); Joachim Knoch, Castrop-Rauxel (DE); Emanuel Loertscher, Zurich (CH); Heike E Riel, Zurich (CH); Walter Heinrich Riess, Zurich (CH); Heinz Schmid, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 691 days.

(21) Appl. No.: 12/870,922

(22) Filed: Aug. 30, 2010

(65) Prior Publication Data

US 2011/0049476 A1  Mar. 3, 2011

(30) Foreign Application Priority Data

Aug. 31, 2009 (EP) .................................. 09169056

(51) Int. Cl.
*H01L 29/06* (2006.01)
*H01L 31/00* (2006.01)

(52) U.S. Cl.
USPC 257/24; 257/401; 257/E21.404; 257/E29.07; 257/E29.245

(58) Field of Classification Search
USPC ................ 257/24, 401, E21.404, E29.07, 257/E29.134, E29.135, E29.245; 977/938
See application file for complete search history.

(56) References Cited

U.S. PATENT DOCUMENTS

| | | | |
|---|---|---|---|
| 6,498,360 B1 * | 12/2002 | Jain et al. ..................... | 257/194 |
| 2006/0113612 A1 | 6/2006 | Gopalakrishnan et al. | |
| 2006/0125041 A1 | 6/2006 | Yang et al. | |
| 2006/0220086 A1 | 10/2006 | Charbuillet et al. | |
| 2007/0228439 A1 * | 10/2007 | Duan et al. .................... | 257/296 |
| 2009/0050876 A1 * | 2/2009 | Marks et al. .................... | 257/24 |
| 2010/0252812 A1 * | 10/2010 | Raychowdhury et al. ...... | 257/24 |

* cited by examiner

*Primary Examiner* — Benjamin Sandvik
*Assistant Examiner* — Leslie Pilar Cruz
(74) *Attorney, Agent, or Firm* — Jennifer R. Davis; Michael J. Chang, LLC

(57) ABSTRACT

An Impact Ionization Field-Effect Transistor (I-MOS) device in which device degradation caused by hot carrier injection into a gate oxide is prevented. The device includes source, drain, and gate contacts, and a channel between the source and the drain. The channel has a dimension normal to the direction of a charge carrier transport in the channel such that the energy separation of the first two sub-bands equals or exceeds the effective energy band gap of the channel material.

21 Claims, 5 Drawing Sheets

70

IMPACT IONIZATION FIELD-EFFECT TRANSISTOR

CROSS-REFERENCE TO RELATED APPLICATION

This application claims priority under 35 U.S.C. 119 from European Application 09169056.0 filed Aug. 31, 2009, the entire contents of which are incorporated herein by reference.

BACKGROUND OF THE INVENTION

1. Field of the Invention

The invention relates to an impact ionization field-effect transistor (I-MOS or I-MOSFET). More particularly, the invention relates to an I-MOS in which device degradation caused by hot carrier injection into a gate oxide is prevented.

2. Description of Related Art

Field-effect transistors typically include source, drain, and gate contacts and/or terminals. The characteristics of a channel region between the source and drain are controlled by applying a voltage to the gate contact in which the gate is separated from the channel by an insulating layer such as an oxide layer. Source, drain and channel typically include a semiconductor material. Subject to the set-up of the field-effect transistor, a depletion region is formed between the source and drain by applying a low voltage to the gate contact. In this setup, the depletion region lacks sufficient mobile charge carriers to enable carrier flow between source and drain. When the gate voltage exceeds a certain threshold, which is called the threshold voltage, an inversion layer is formed in the channel along the gate oxide. The inversion layer includes mobile charge carriers such that a low resistance conducting path enables carrier flow between source and drain.

Above the threshold voltage, i.e. in the ON state of the field-effect transistor, the current between source and drain is limited by the channel resistance. For voltages below the threshold voltage, the inverse sub-threshold slope S, where the inverse sub-threshold slope S is denoted by $$S = [d(\log_{10} I_D)/dV_G]^{-1}$$

with $I_D$ being the drain current, and $V_G$ being the gate voltage, characterizes the required increase of the gate voltage resulting in a slope of the current in decades (in a logarithmic scale). The inverse sub-threshold slope may be used as a measure for switching characteristics of the field-effect transistor. The lower the inverse sub-threshold slope value is, the faster switching can be achieved between OFF and ON states and vice versa. One of the main obstacles for improving the performance of conventional field-effect transistors is the fundamental room-temperature (RT) limit of the inverse sub-threshold slope of about 60 mV/decade set by the Fermi distribution function.

A device having inverse sub-threshold slope values lower than about 60 mV/decade is the impact ionization field-effect transistor. The impact ionization field-effect transistor is basically represented by a p-i-n diode with a partially gated intrinsic region. This device is built on the effect of impact ionization in the channel triggered by a modulation of the gate voltage followed by an avalanche multiplication of ionization as an internal multiplication mechanism. For generating the avalanche in ionization, the device is tuned into breakdown by modulating the gate voltage. For enabling such tuning into breakdown, the device is biased close to the breakdown voltage. Impact ionization field-effect transistors may exhibit very steep transitions from OFF state to ON state with an inverse sub-threshold slope of about 10 mV/dec at 300 K.

FIG. 1 illustrates a schematic cross-section of an impact ionization field-effect transistor (I-MOS) according to the state of the art. The I-MOS 01 is basically formed by a p-i-n diode with a p-doped region 02, an n-doped region 03 and an intrinsic region 04, i.e. the channel between the p-doped region 02 and the n-doped region 03. The intrinsic region 04 is partially gated by a gate 05 arranged above a part of the intrinsic region 04. A gate dielectric insulator 06, typically a gate oxide, is arranged between the gate 05 and the intrinsic region 04. The p-i-n structure is built on a buried oxide 07.

The I-MOS 01 is reverse biased close to breakdown. The I-MOS 01 is tuned in and out of breakdown by modulating the gate voltage. When tuned into breakdown impact ionization occurs followed by avalanche multiplication in order to create an internal carrier multiplication mechanism.

Such impact-ionization transistors based on field-effect control are known, for example, from US 2006/0113612 A1, US 2006/0125041 A1 or US 2006/0220086 A1.

FIG. 2 shows a three-dimensional perspective view of the I-MOS 01 according to FIG. 1. The drawing includes an energy potential diagram 08 plotted above the device 01. It can be observed from the energy potential diagram 08 that charge carriers become accelerated towards the gate oxide 06, as indicated by the arrow. This effect is called hot carrier injection into the gate oxide which leads to a hot carrier degradation of the gate oxide after a few voltage sweeps, in turn leading to a degradation of the device characteristics. The presence of significant hot carrier effects, in particular the injection of charge carriers into the gate dielectric leads to a shift of the threshold voltage and a degradation of the inverse sub-threshold slope over time. In high performance logic applications such effects are not desired.

SUMMARY OF THE INVENTION

To overcome these deficiencies, the present invention provides an impact ionization field-effect transistor, which includes: a source; a gate contact; a drain; and a channel formed from a channel material for charge carrier transport between the source and the drain, the gate contact being in close proximity to the channel, wherein the channel has a dimension normal to the direction of the charge carrier transport in the channel such that the energy separation of the first two energy sub-bands equals or exceeds the effective energy band gap of the channel material.

According to another aspect of the invention, an impact ionization field-effect transistor is provided, which includes: a source; a gate contact; a drain; a channel formed from a channel material for charge carrier transport between the source and the drain; and an insulating gate dielectric interposed between a first portion of the channel and the gate contact; wherein the channel has a dimension normal to the direction of the charge carrier transport in the channel such that the energy separation of the first two energy sub-bands equals or exceeds the effective energy band gap of the channel material.

According to yet another aspect of the invention, an impact ionization field-effect transistor is provided. The impact ionization field-effect transistor includes: a source; a gate contact; a drain; and a channel, formed from a channel material, for charge carrier transport between the source and the drain, further including an insulating gate dielectric interposed between a first portion of the channel and the gate contact, wherein the gate dielectric includes a high k-material, wherein the channel has a dimension normal to the direction of the charge carrier transport in the channel such that the energy separation of the first two energy sub-bands equals or exceeds the effective energy band gap of the channel material, and the effective band gap of the channel material is equal to or less than 1 eV, wherein the channel material is an intrinsic semiconductor, the source is a doped semiconductor and the drain is a doped semiconductor.

The invention and its embodiments will be more fully appreciated by reference to the following detailed description of the illustrative embodiments in accordance with the present invention when taken in conjunction with the accompanying drawings.

DETAILED DESCRIPTION OF THE PREFERRED EMBODIMENTS

The principle idea of the invention is that by utilizing quantum confinement effects there is achieved a one-dimensional or at least two-dimensional (in case there is no lateral confinement of the channel) charge carrier transport avoiding (hot) charge carrier acceleration normal to the charge carrier transport, i.e. towards the gate oxide and hence suppressing hot carrier degradation.

This effect is engineered by providing the channel with a dimension normal to the charge carrier transport for which dimension the energy separation of the first two energy sub-bands of the channel material equals or exceeds the effective energy band gap of the channel material. As a result, a distinct energy sub-band and an appropriate band gap are engineered. This ensures that the charge carriers remain in the first sub-band when reaching the threshold energy for impact ionization. As a result, the charge carrier transport remains one-dimensional in the channel or at least two-dimensional in case there is no lateral confinement for the channel. This holds even for hot carriers.

Figure 1:
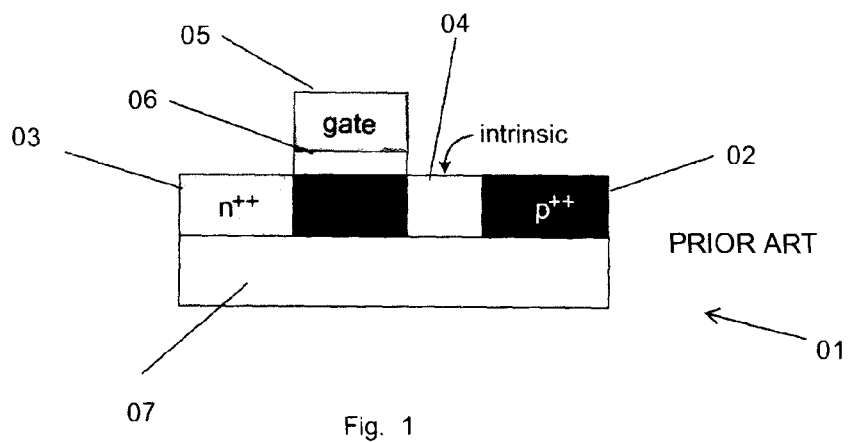
FIG. 1: a schematic cross-section of an I-MOS according to the prior art.
Figure 2:
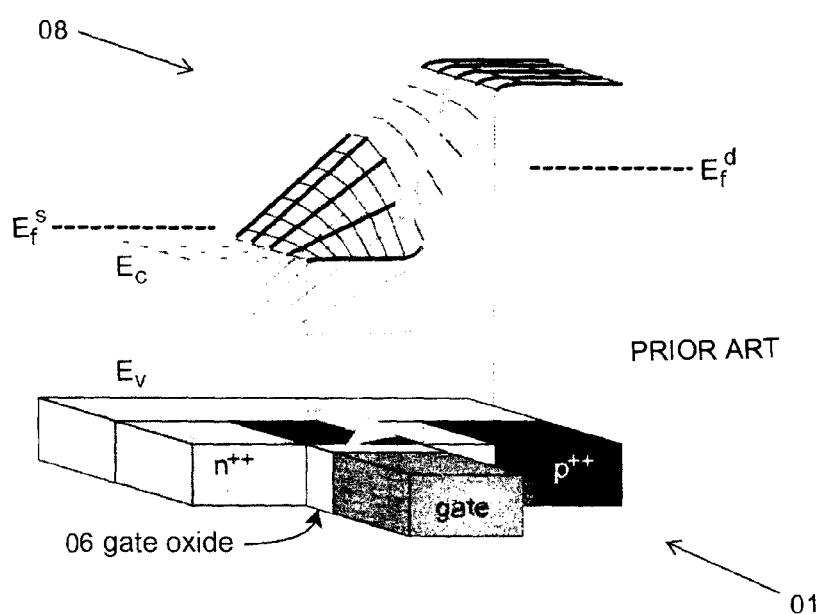
FIG. 2: a perspective view of the I-MOS of FIG. 1, and an associated energy potential diagram.
Figure 3:
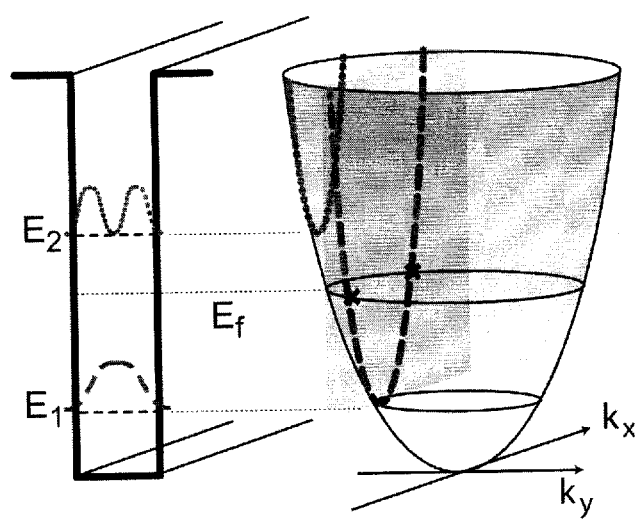
FIG. 3: a schematic illustration of sub-band energy levels of a very thin nanowire channel structure.

FIG. 3 schematically illustrates sub-band energy levels of a very thin channel formed as a nanowire and built from a semiconductor material. For such small dimensions of the channel, quantization vertical to the nanowire axis will occur and form so-called sub-bands. Vector $k_x$ also denotes the dimension perpendicular to the channel axis (the nanowire axis in this embodiment) i.e. the direction of the charge carrier transport. Vector $k_y$ also denotes a dimension normal to the channel axis $k_z$. Energy levels E1 and E2 are illustrated indicating energy levels of charge carriers of the respective energy sub-band they belong to. The bottom of the well-like energy level structure denotes the energy level of the conduction band of the subject channel material.

The dotted line graphs at the respective energy levels E1 and E2 in the well-like structure denote the probability of charge carriers taking a specific position along the $k_y$ axis. When translating such probability into device geometry there is a certain probability for a charge carrier to be located in the middle of the channel with a more or less balanced distance to the gate oxide and/or the bulk, and there is a certain probability for a charge carrier to be located close to the edges of the channel, i.e. close to the gate oxide or the bulk. Specifically, for the first energy sub-band, the probability that a charge carrier can be assumed in the middle of the channel is significantly higher than for locations close to the edges of the channel. To the contrary, for the second energy sub-band, the probability that a charge carrier can be assumed in the middle of the channel is very low and is significantly higher at locations closer to the edges of the channel, i.e. at locations closer to the oxide and/or the bulk.

However, charge carriers being located close to the edges of the channel are most likely to be transferred into the gate dielectric causing degradation effects of the device. For this reason, the idea of the present invention builds on the insight that limiting charge carriers to the first energy sub-band E1 in an impact ionization field-effect transistor is beneficial over allowing charge carrier presence in higher energy sub-bands.

For a channel being embodied as a nanowire, the sub-band energy levels are approximately inversely proportional to the square of the nanowire diameter, $d_{NW}$, if a square cross section is assumed, which is done here for simplicity. Under these assumptions the sub-band energy levels $E_n$ in the conduction band for sub-band index n can be determined by $$E_n = 2\frac{\hbar^2 \pi^2}{2md_{NW}^2} n^2 \qquad (1)$$

where $\hbar$ denotes the Planck constant, and m denotes the mass of a charge carrier. In this case, $E_n$ is proportional to $(1/d_{NW}^2)$. For a circular cross section, $E_n$ is proportional to $(1/R_{NW}^2)$, where $R_{NW}$ is the radius of the nanowire, but with a different multiplication factor than for the square cross section. In these two cases, $d_{NW}$ and $R_{NW}$ have to be sufficiently small to achieve energy confinement in the x and y directions, assuming the z-direction is the direction of charge carrier transport. These shapes lead to two-dimensional confinement. Similarly, in a rectangle where both $d_x$ and $d_y$ are sufficiently small, two-dimensional confinement is also achieved. In the case where $d_x$ is not sufficiently small but $d_y$ is, and $d_y$ is in the direction of the gate oxide, then one-dimensional confinement is achieved. In this case, $E_n$ is proportional to $(1/d_y^2)$, but with a different multiplication factor.

Specifically, for energy sub-bands E1 and E2, charge carriers that have energies equal to or above E1 and below E2 remain in the first sub-band and have different k-vectors, i.e. momentum, only along the direction of current transport, which is the channel axis. Perpendicular to the wire axis, all carriers with energy below E2 have the same small perpendicular k-vector that belongs to the sub-band energy E1. This means, if a charge carrier remains in the first sub-band and the channel geometry does not allow for a charge carrier transport in a lateral direction but is a wire-like channel or a channel of similar geometry, a one-dimensional transport of charge carriers is obtained.

The concept of an I-MOS device provides for high electric fields needed to induce impact ionization which in turn leads to an avalanche breakdown. Given that the energy portions needed for such impact ionization are of a value significantly higher than $k_B T$ (Boltzmann's Constant×Temperature) a one-dimensional transport can only be achieved when the energy sub-band separation is large enough that even hot carriers generated in the intrinsic portion of the device remain in the first sub-band. As a result, hot carrier degradation is strongly suppressed since the hot carriers all have only the same, small vertical k-vector that does not lead to a significant injection of carriers into the gate oxide.

The effective energy band gap represents the minimum energy carriers have to gain in order for impact ionization to occur since impact ionization implies the excitation of an electron from the valence band into the conduction band, and more specifically into the first sub-band of the conduction band. The effective energy band gap denotes this energy barrier which is dependent on the material used for the channel and which is also variable subject to the dimension of the channel normal to the transport direction due to quantization effects.

Such energy portion, i.e. an energy portion equivalent to the effective energy band gap should, however, not enable a charge carrier such as an electron on the first sub-band to be lifted to the second sub-band by that allowing for a "vertical" charge carrier transport towards the gate oxide again. This requires a band gap engineering of the semiconductor channel such that the energy separation of the first two energy sub-bands of the channel material is larger than the effective energy band gap, again, assuming that the effective energy band gap approximately equals the threshold energy $E_{thresh}$ for impact ionization.

This ensures that the charge carriers remain in the first sub-band when reaching the threshold energy $E_{thresh}$ for impact ionization. As a result, the transport remains one-dimensional, provided there is a lateral confinement of the channel, even for hot carriers.

According to an embodiment of the invention it is preferred to use a channel material for which at some diameter of the channel the separation of sub-bands E2-E1 becomes larger than the effective energy band gap. In this case, charge carriers can obtain enough energy to surmount the threshold energy for impact ionization but still remain within the first sub-band.

Decreasing the channel diameter (in the following the term diameter is used for indicating the dimension normal to the main charge carrier transport direction in the channel) increases the vertical quantization and therefore works towards a one-dimensional charge carrier transportation even if carriers get hot. However, at the same time the effective energy band gap may increase such that higher fields are required and higher gate voltages need to be applied in order to initiate impact ionization. This is an undesired effect as for devices with steep inverse sub-threshold slopes low operation voltages are preferred in order to scale the entire device down in size. A down-scale in size is needed in order to decrease the power consumption of an integrated circuit based on such devices, particularly since the power consumption has become one of the main concerns and roadblocks for preventing a further increase of device density and clock-speed of highly integrated circuits.

In an embodiment, a preferred choice of material will fulfill the following requirements:

at a technologically feasible diameter of the channel the energy sub-band separation E2-E1 is larger than the effective energy band gap, and the effective energy band gap which represents the threshold energy for impact ionization is equal to or smaller than 5 eV, and most preferably equal to or smaller than 1 eV.

By way of implementing the second requirement, low operating voltages of the I-MOS device can be ensured.

Figure 4:
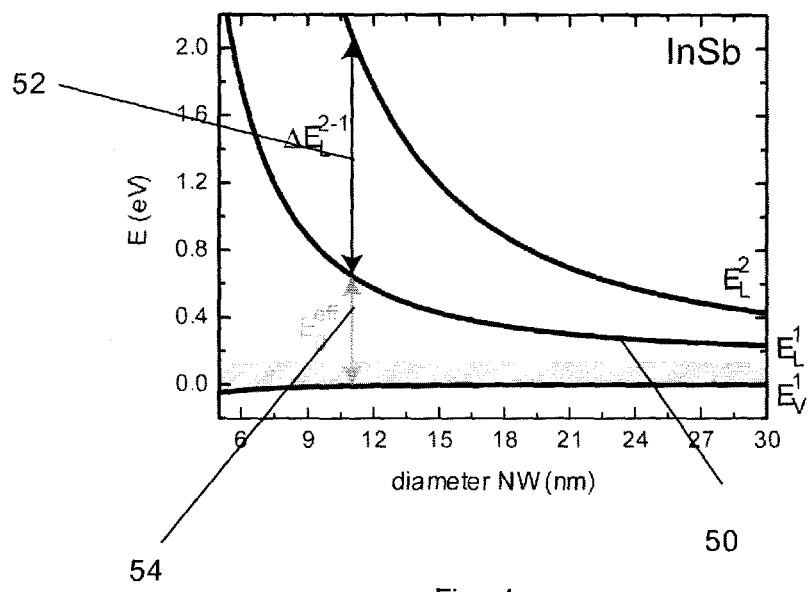
FIG. 4: a diagram showing energy characteristics over a channel diameter for a first channel material.

The diagram in FIG. 4 illustrates the interrelation of the parameters as discussed above for InSb as the channel material for a wire-like channel having a diameter NW. Line $E_V^1$ illustrates the first sub-band in the valence band, $E_L^1$ the first sub-band in the conduction band, and $E_L^2$ the second sub-band in the conduction band. The difference between $E_L^1$ and $E_V^1$ represents the effective energy band gap, $E_g^{eff}$, for InSb. The dependence of $E_g^{eff}$ on the diameter is obtained with a simple "particle in the box" quantum mechanical calculation (as described in Eqn. (1)).

At a diameter of approximately 11 nm the energy separation of the first two sub-bands $\Delta E_L^{2-1}=E_L^2-E_L^1$ (arrow 52) is significantly larger than the effective energy band gap $E_g^{eff}$ (arrow 54).

Suppose that the desired maximum threshold energy for impact ionization to achieve low operating voltages, and hence the maximum effective energy band gap $E_g^{eff}$, is on the order of 1 eV, then the minimum wire diameter NW is approximately 8 nm in the present embodiment.

Figure 5:
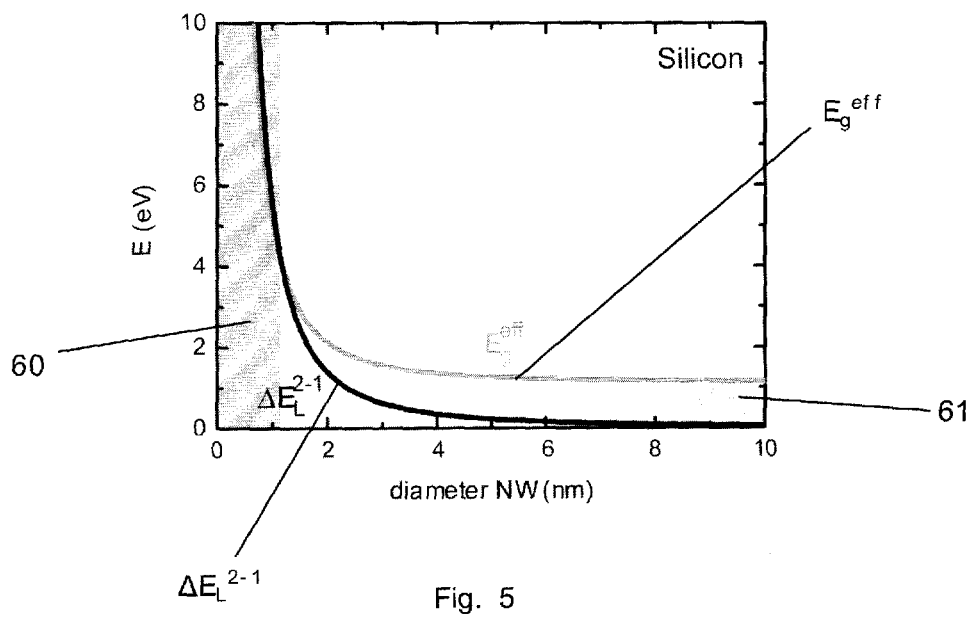
FIG. 5: a diagram showing energy characteristics over a channel diameter for a second channel material.

In FIG. 5, the diagram illustrates the interrelation of the same parameters, now for silicon as channel material for a wire-like channel having a diameter NW. The requirement for the energy separation of the first two sub-bands is only fulfilled for an area 60. This requires a channel diameter NW of approximately at most 1 nm. The area referenced as 61 illustrates for which diameters NW the effective energy band gap $E_g^{eff}$ and hence the threshold energy remains below 1 eV. There is no overlap between the two areas 60 and 61. This means that silicon could be used as channel material at very small diameters, however, such device must be operated at rather large voltages. A possible means for improvement is band gap tuning, for example, by using strained silicon or strained/unstrained germanium. The example in FIG. 5 refers to unstrained silicon.

Figure 6:
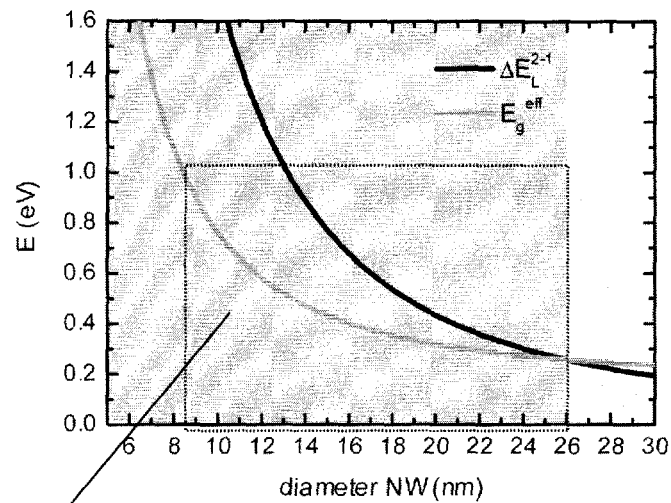
FIG. 6: a diagram showing energy characteristics over a channel diameter for the first channel material.

In an embodiment of the invention, III-V semiconductors are used as the channel material, and III-V materials and/or oxide materials are used as the gate dielectric insulator material. In particular, the channel can be of InSb, or of InAs. Both materials exhibit a rather small effective energy band gap $E_g^{eff}$. As can be seen from FIG. 6, for InSb, there is a large area 70 for which the sub-band engineering requirement is matched as well as the optional requirement that the effective energy band gap $E_g^{eff}$ remains below 1 eV. Between approximately a channel wire diameter NW of 26 nm and 8 nm the effective energy band gap $E_g^{eff}$ is smaller than 1 eV and also smaller than the sub-band separation $\Delta E_L^{2-1}=E_L^2-E_L^1$. In addition, the wire diameters are in a technologically feasible range.

In another embodiment of the invention, Indium-Antimonide (InSb) or Indium-Arsenide (InAs) or $In_{1-x}Ga_xAs$ (with variable x) compound are used as the channel material.

Figure 7:
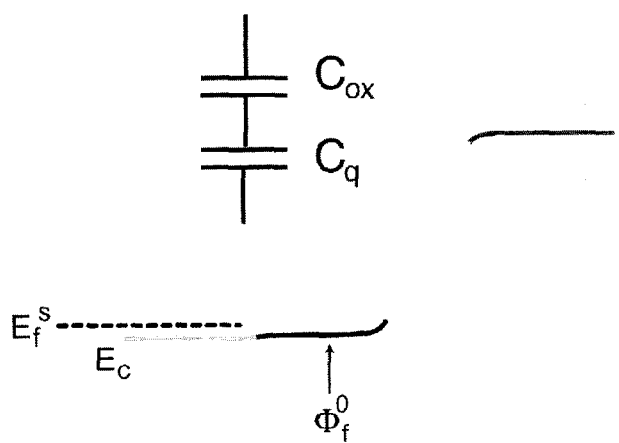
FIG. 7: a diagram illustrating capacitance characteristics in a channel.

Focus is now turned to capacitance considerations. Under the assumption of electrostatic integrity, which implies a properly scaled device that does not exhibit short channel effects, the gate capacitance of a field effect transistor, i.e. the capacitance between the gate contact and the bulk/substrate is formed by a series of a geometrical or oxide capacitance $C_{ox}$ and a so-called inversion-layer, semiconductor or quantum capacitance $C_q$. The quantum capacitance $C_q$ is subject to the charge carrier concentration in the channel resulting in a potential in the inversion layer as denoted with $\Phi_f^0$ in FIG. 7. This means that a portion of the applied gate voltage drops across the gate oxide. A second portion drops across the active channel.

For instance, in a three-dimensional channel system in which the charge carriers are allowed to take many different states, an increase in the gate voltage results in an increased density of states in the channel. Since the quantum capacitance $C_q$ is proportional to the density of states and increases approximately by $\sqrt{E_f^s - \Phi_f^0}$ where $E_f^s$ is the source Fermi level, the quantum capacitance $C_q$ increases and becomes much larger than the oxide capacitance $C_{ox}$. Following the mathematics of capacitances arranged in series, the total capacitance of a system in which the quantum capacitance $C_q$ is much greater than the oxide capacitance $C_{ox}$, the total capacitance is dominated by the oxide capacitance $C_{ox}$. The oxide capacitance $C_{ox}$ in turn is dependent from the geometry of the oxide layer and the oxide material. The oxide capacitance $C_{ox}$ can be calculated by $$C_{ox} = \frac{2\pi\varepsilon_0\varepsilon_{ox}}{\ln(1+2d_{ox}/d_{nw})} \quad (2)$$

where $d_{nw}$ denotes the diameter of the channel, and $d_{ox}$ denotes the thickness of the gate oxide. As a result, in such a system there is little control on the charge and the potential in the channel by the gate voltage. In other words, all the gate voltage drops across the gate oxide, and the field effect transistor behaves like a plate capacitor. A conventional MOSFET shows such effect.

Figure 8:
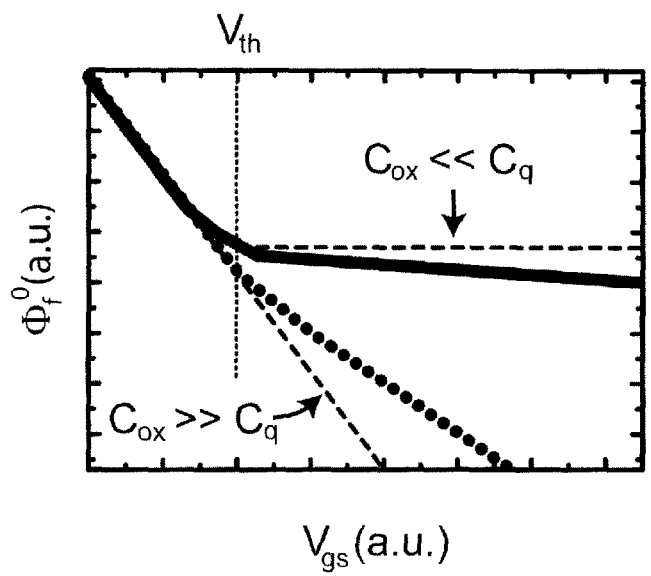
FIG. 8: a diagram illustrating the potential $\Phi_f^0$ in the inversion layer of the channel for gate voltages $V_{gs}$ especially above the threshold voltage $V_{th}$ in an I-MOS architecture including a wrap gate structure.

This effect can be further illustrated by the diagram in FIG. 8. FIG. 8 depicts the potential $\Phi_f^0$ in the inversion layer of the channel for gate voltages $V_{gs}$ especially above the threshold voltage $V_{th}$ in an I-MOS architecture including a wrap gate structure.

For the above scenario in which the quantum capacitance $C_q$ is much greater than the oxide capacitance $C_{ox}$ ($C_{ox} \ll C_q$) the potential $\Phi_f^0$ can be derived to be more or less independent from the gate voltage $V_{gs}$ and thus the Gate voltage $V_{gs}$ loses control over the channel. The dashed line depicts an ideal scenario with an infinite quantum capacitance $C_q$. The straight bold line depicts a real scenario with a finite quantum capacitance $C_q$.

In contrast, in a one-dimensional system, the density of states may drop with increasing gate voltages $V_{gs}$, and consequently the potential $\Phi_f^0$ and the quantum capacitance $C_q$ may drop, too.

In such system, the quantum capacitance is proportional as follows:

$$C_q \propto D(E_f^s) \propto \sqrt{\frac{m^*}{E_f^s}} \quad (3)$$

where $D(E_f^s)$ is the density of states and $m^*$ is the effective mass.

The gate design, in an embodiment is a very thin gate oxide, and the channel dimension, again in an embodiment is a very thin channel i.e. a channel with a diameter of very few nanometers, may help to reach the so-called quantum capacitance limit where $C_q \ll C_{ox}$. In this case, the total capacitance is dominated by the quantum capacitance $C_q$ and therefore the potential $\Phi_f^0$ in the inversion layer of the channel is determined by the gate voltage $V_{gs}$ and not the charge in the channel. In an extreme case, the energy position of the bands is fixed by the applied gate voltage $V_{gs}$ irrespective of the charge in the channel. This quantum capacitance limit is likely to be attained in one-dimensional systems and is particularly desired in I-MOS devices according to embodiments of the present invention. In order to attain the quantum capacitance limit it is preferred to scale down the gate dielectric, i.e. lower its thickness and/or use of a high-k material such that the oxide capacitance exceeds the quantum capacitance.

Figure 9:
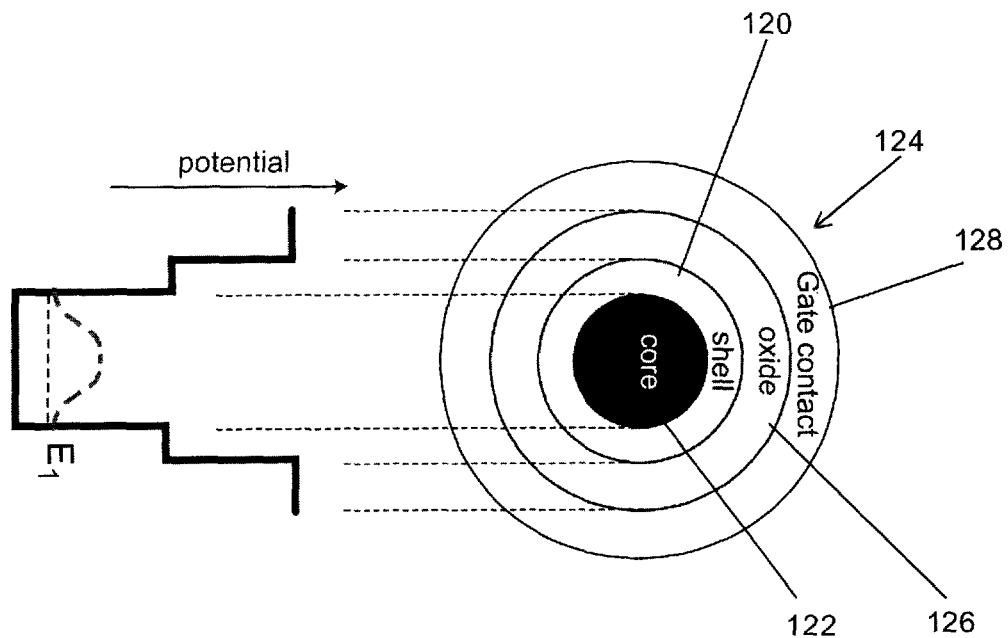
FIG. 9: a cross-sectional view of a channel including gate oxide and associated energy levels.

In an embodiment of the invention, the channel includes a core 122 and a shell 120 according to FIG. 9. Such core-shell structure 124 helps improve the operational stability of the device. For example, an InSb core with a CdTe shell may be covered with a dielectric coating 126 and a conductive surround gate 128. In FIG. 9, the shell 120 is arranged around the core 122, i.e. the channel. The shell material has a larger band gap than the band material such that even if a charge carrier is injected into the shell it will find its way back to the core. The oxide is moved further away from the channel. If carriers are injected into the shell it is less likely that they will end up in the oxide since it is further away than when having no shell. If the carriers end up in the shell and do not get transferred into the oxide, they will move back into the channel again, which would not happen in an oxide where they would get trapped. In addition, the core-shell structure 124 helps reduce interface roughness scattering since the charge carriers are separated from the gate dielectric interface. This is important for increasing the achievable on-state current.

Generally, although some of the exemplary embodiments illustrate a concentric circular channel shape, it is contemplated that other suitable geometries may be used. For example, the cross-sectional shapes of the individual element may be other shapes besides circular, such as elliptical, oval, square or rectangular. With respect to the channel, in addition to the embodiment of a nanowire structure element, the channel could also be formed from other structures such as a semiconductor fin or a carbon nanotube, for example. The gate may take different shapes, too: The gate may completely surround other layers (e.g., the insulator layer surrounding the channel), however, it is also contemplated that the gate may only partially surround an inner layer of the structure, such as an omega (Ω) shape, or a Pi-gate design, or a tri-gate design, or be shaped as conventional "on top" gate on top of a rectangular channel geometry.

The I-MOS device as presented exhibits a substantially one-dimensional electron system. Quantum confinement effects are utilized in order to avoid acceleration of hot carriers perpendicular to the current flow and hence suppress hot carrier degradation. In addition, the one-dimensional nature of the transport enables a decrease of the operating voltage due to gate-control of the potential in the gated area, in contrast to a charge-control in conventional I-MOS devices. As a result of the design rules according to the present invention such devices exhibit an inverse sub-threshold slope of significantly less than 60 mV/dec at room temperature, subject to the choice of channel material and diameter, on the order of 5 mV/dec or below.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An impact ionization field-effect transistor, comprising:
a source;
a gate contact;
a drain; and
a channel formed from a channel material for charge carrier transport between said source and said drain, said gate contact being in close proximity to said channel, wherein said channel has a dimension normal to the direction of said charge carrier transport in said channel such that an energy separation of a first two energy sub-bands equals or exceeds an effective energy band gap of said channel material, and where the channel is partially gated by the gate contact which is located adjacent to a portion of the channel proximal to the source or the drain.

2. The field-effect transistor according to claim 1, wherein said channel material is an intrinsic semiconductor, said source is a doped semiconductor and said drain is a doped semiconductor.

3. The field-effect transistor according to claim 2, wherein said channel dimension normal to the direction of said charge carrier transport is such that the effective band gap of said channel material is equal to or less than 1 eV.

4. The field-effect transistor according to claim 1, wherein said channel material is a III-V compound semiconductor, and said gate dielectric insulator comprises at least one of an oxide material and a III-V material with larger effective energy band gap than the band gap of said channel material.

5. The field-effect transistor according to claim 1, wherein said channel material is selected from the group consisting of an Indium-Antimonide (InSb), Indium-Arsenide (InAs), and $In_{1-x}Ga_xAs$ (with variable x) compound semiconductor.

6. The field-effect transistor according to claim 1, wherein said channel material is selected from the group consisting of strained silicon, strained germanium, and unstrained germanium.

7. The field-effect transistor according to claim 1, wherein said channel is comprised of a semiconductor nanowire.

8. The field-effect transistor according to claim 7, wherein said semiconducting nanowire comprises a core and a shell around the core, said shell being made from a material having a larger effective energy band gap than the band gap of said core, said gate contact being arranged around said shell.

9. The field-effect transistor according to claim 1, wherein an oxide capacitance ($C_{ox}$) exceeds a quantum capacitance ($C_q$) for voltages above a threshold voltage ($V_{th}$).

10. An impact ionization field-effect transistor, comprising:
a source;
a gate contact;
a drain; and
a channel formed from a channel material for charge carrier transport between said source and said drain;
an insulating gate dielectric interposed between a first portion of said channel and said gate contact;
wherein said channel has a dimension normal to a direction of said charge carrier transport in said channel such that an energy separation of a first two energy sub-bands equals or exceeds an effective energy band gap of said channel material, and where the channel is partially gated by the gate contact which is located adjacent to a portion of the channel proximal to the source or the drain.

11. The field-effect transistor according to claim 10, wherein said channel material is an intrinsic semiconductor, said source is a doped semiconductor and said drain is a doped semiconductor.

12. The field-effect transistor according to claim 11, wherein said channel dimension normal to the direction of said charge carrier transport is such that the effective band gap of said channel material is equal to or less than 1 eV.

13. The field-effect transistor according to claim 10, wherein said channel material is a III-V compound semiconductor, and said gate dielectric insulator comprises at least one of an oxide material and a III-V material with larger effective energy band gap than the band gap of said channel material.

14. The field-effect transistor according to claim 10, wherein said channel material is selected from the group consisting of an Indium-Antimonide (InSb), Indium-Arsenide (InAs), and $In_{1-x}Ga_xAs$ (with variable x) compound semiconductor.

15. The field-effect transistor according to claim 10, wherein said channel material is selected from the group consisting of strained silicon, strained germanium, and unstrained germanium.

16. The field-effect transistor according to claim 10, wherein said gate dielectric comprises a high k-material.

17. The field-effect transistor according to claim 10, wherein said channel is comprised of a semiconductor nanowire.

18. The field-effect transistor according to claim 17, wherein said semiconducting nanowire comprises a core and a shell around the core, said shell being made from a material having a larger effective energy band gap than the band gap of said core, said gate contact being arranged around said shell.

19. The field-effect transistor according to claim 10, wherein an oxide capacitance ($C_{ox}$) exceeds a quantum capacitance ($C_q$) for voltages above a threshold voltage ($V_{th}$).

20. An impact ionization field-effect transistor, comprising:
a source;
a gate contact;
a drain; and
a channel, formed from a channel material, for charge carrier transport between said source and said drain, further comprising an insulating gate dielectric interposed between a first portion of said channel and said gate contact, wherein said gate dielectric comprises a high k-material, wherein said channel has a dimension normal to a direction of said charge carrier transport in said channel such that an energy separation of a first two energy sub-bands equals or exceeds an effective energy band gap of said channel material, and the effective band gap of said channel material is equal to or less than 1 eV, wherein said channel material is an intrinsic semiconductor, said source is a doped semiconductor and said drain is a doped semiconductor, and where the channel is partially gated by the gate contact which is located adjacent to a portion of the channel proximal to the source or the drain.

21. The field-effect transistor according to claim 20, wherein said channel is comprised of a semiconductor nanowire, said semiconducting nanowire comprises a core and a shell around the core, the shell being made from a material having a larger effective energy band gap than the band gap of said core, said gate contact being arranged around said shell.

* * * * *